United States Patent
Xiong et al.

(10) Patent No.: US 9,461,131 B1
(45) Date of Patent: Oct. 4, 2016

(54) HIGH QUALITY DEEP TRENCH OXIDE

(71) Applicant: Texas Instruments Incorporated, Dallas, TX (US)

(72) Inventors: Yufei Xiong, Chengdu (CN); Yunlong Liu, Chengdu (CN); Hong Yang, Richardson, TX (US); Jianxin Liu, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 46 days.

(21) Appl. No.: 14/739,230

(22) Filed: Jun. 15, 2015

(51) Int. Cl.
| | |
|---|---|
| H01L 21/336 | (2006.01) |
| H01L 27/108 | (2006.01) |
| H01L 29/423 | (2006.01) |
| H01L 27/088 | (2006.01) |
| H01L 27/06 | (2006.01) |
| H01L 49/02 | (2006.01) |
| H01L 29/78 | (2006.01) |
| H01L 21/3065 | (2006.01) |
| H01L 21/308 | (2006.01) |
| H01L 21/28 | (2006.01) |

(52) U.S. Cl.
CPC ..... *H01L 29/42364* (2013.01); *H01L 21/2822* (2013.01); *H01L 21/28185* (2013.01); *H01L 21/28202* (2013.01); *H01L 21/28238* (2013.01); *H01L 21/308* (2013.01); *H01L 21/3065* (2013.01); *H01L 27/0629* (2013.01); *H01L 27/088* (2013.01); *H01L 28/40* (2013.01); *H01L 29/4236* (2013.01); *H01L 29/7827* (2013.01)

(58) Field of Classification Search
CPC ............... H01L 29/42364; H01L 21/3065; H01L 29/4236; H01L 21/28202; H01L 21/28185; H01L 21/308; H01L 27/0629; H01L 21/2822; H01L 27/088; H01L 28/40; H01L 29/7827; H01L 21/28238
See application file for complete search history.

*Primary Examiner* — Su C Kim
*Assistant Examiner* — Junaiden Mirsalahuddin
(74) *Attorney, Agent, or Firm* — Jacqueline J. Garner; Frank D. Cimino

(57) ABSTRACT

An integrated circuit including a trench in the substrate with a high quality trench oxide grown on the sidewalls and the bottom of the trench where the ratio of the thickness of the high quality trench oxide formed on the sidewalls to the thickness formed on the bottom is less than 1.2. An integrated circuit including a trench with high quality oxide is formed by first growing a sacrificial oxide in dilute oxygen at a temperature in the range of 1050° C. to 1250° C., stripping the sacrificial oxide, growing high quality oxide in dilute oxygen plus trans 1,2 dichloroethylene at a temperature in the range of 1050° C. to 1250° C., and annealing the high quality oxide in an inert ambient at a temperature in the range of 1050° C. to 1250° C.

14 Claims, 14 Drawing Sheets

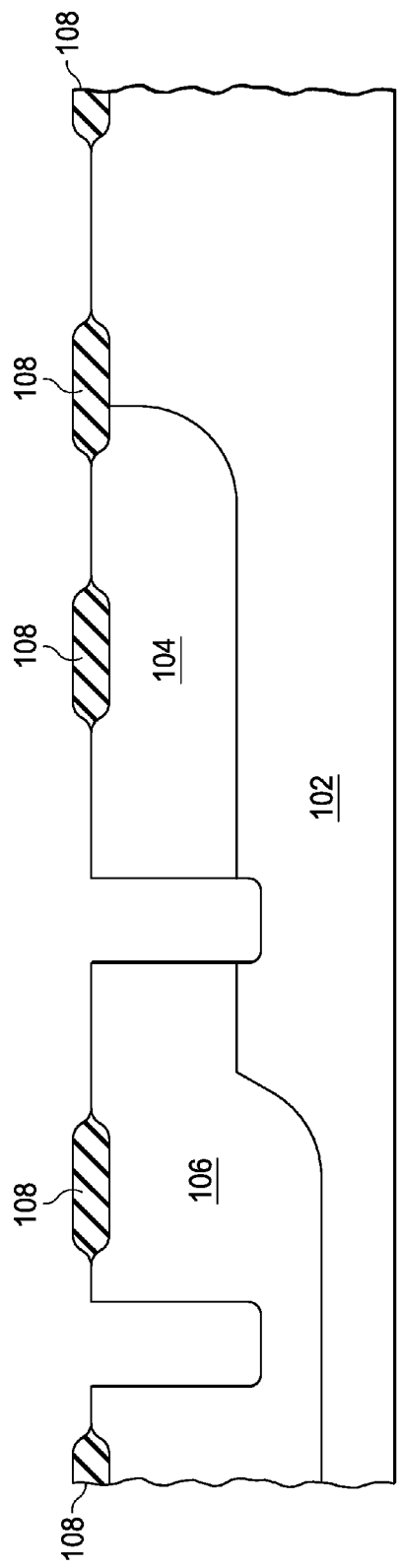
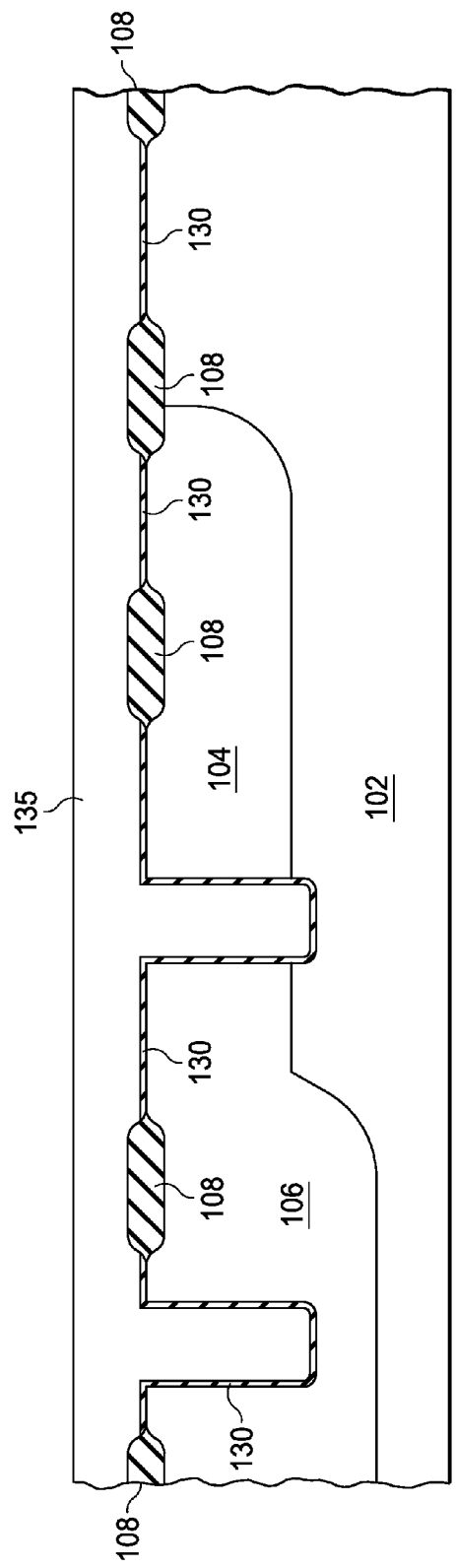
FIG. 2H
FIG. 2I

HIGH QUALITY DEEP TRENCH OXIDE

FIELD OF THE INVENTION

This invention relates to the field of integrated circuits. More particularly, this invention relates growing a high quality oxide in a trench in a silicon substrate.

BACKGROUND OF THE INVENTION

Vertical structures such as vertical high power transistors and trench capacitors are becoming more prevalent in integrated circuits to reduce area. Trench capacitors and vertical transistors formed on the sidewalls of trenches occupy significantly less area than planar capacitors and planar transistors which are built on the semiconductor surface.

A major challenge in building vertical capacitors and vertical transistors is to grow high quality, uniform dielectric on the sidewalls and bottom of the trenches. This becomes increasingly difficult as the trenches get narrower and deeper. The trench etch may cause roughness on the trench sidewalls and may cause sharp corners at the bottom of the trenches. The electric field may be enhanced at rough spots and sharp corners causing increased leakage current through the trench oxide accelerating the wear out and reducing the lifetime of the dielectric.

In addition the growth rate of silicon dioxide is different for the different crystal planes exposed on the trench sidewalls and trench bottom. The ratio of silicon dioxide thickness on a trench sidewall to the thickness on the bottom of the trench is typically about 1.7. Nonuniformity in the dielectric thickness degrades the performance of the vertical MOS transistors and trench capacitors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes a trench with a high quality trench oxide grown on the sidewalls and the bottom of the trench where the ratio of the thickness of the high quality trench oxide formed on the sidewalls to the thickness formed on the bottom is less than 1.2. An integrated circuit including a trench with high quality oxide is formed by first growing a sacrificial oxide in dilute oxygen at a temperature in the range of 1050° C. to 1250° C., stripping the sacrificial oxide, growing high quality oxide in dilute oxygen plus trans 1,2 dichloroethylene at a temperature in the range of 1050° C. to 1250° C., and annealing the high quality oxide in an inert ambient at a temperature in the range of 1050° C. to 1250° C.

DESCRIPTION OF THE VIEWS OF THE DRAWING

FIG. 2A through FIG. 2J are cross sections of the integrated circuit of FIG. 1 depicted in successive stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
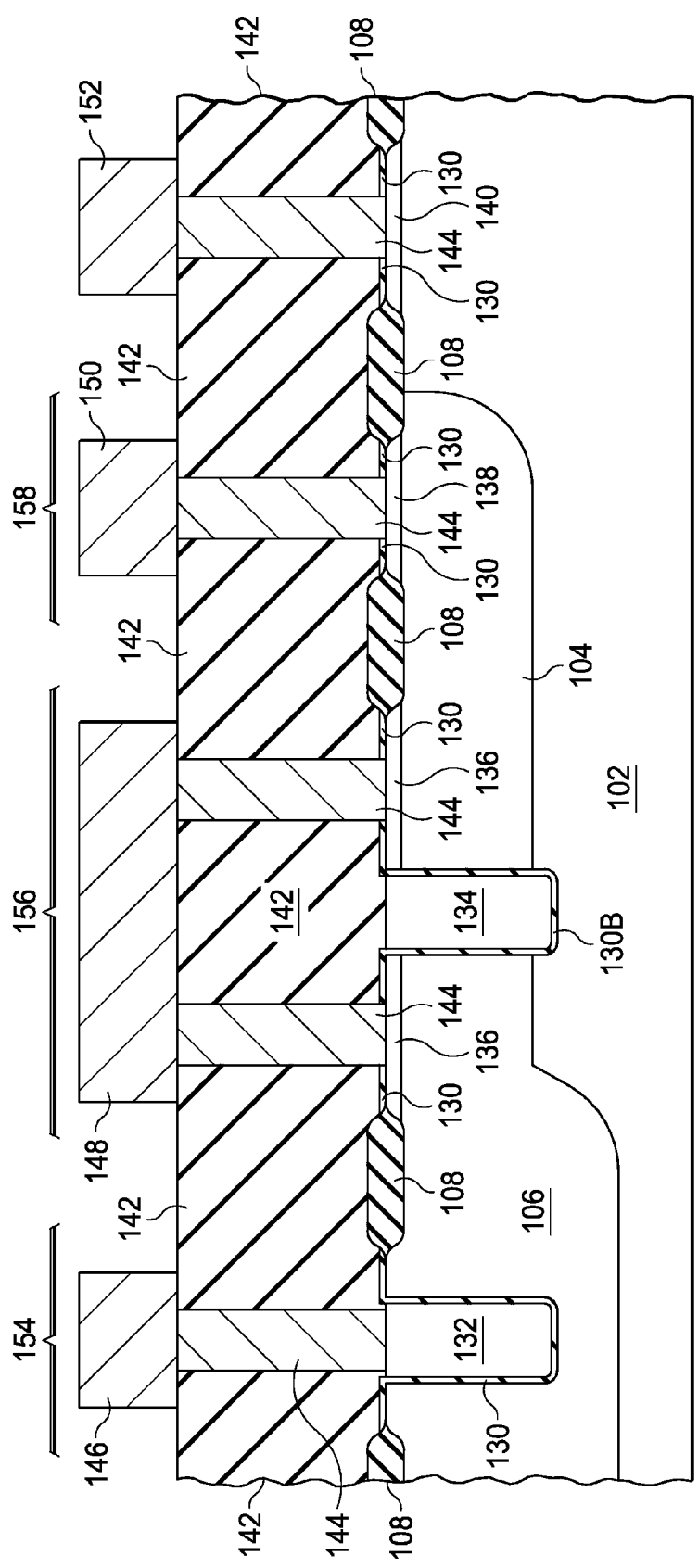
FIG. 1 is a cross section of an example integrated circuit containing a trench with high quality trench oxide on the sidewalls and bottom of the trench

An example integrated circuit with trenches with high quality deep trench oxide is shown in FIG. 1. High quality silicon dioxide is characterized by a low level of electron traps and dangling bonds. High quality silicon dioxide formation is facilitated by growing at temperatures high enough to enable viscous flow of the silicon dioxide typically higher than about 900° C. High quality silicon dioxide films grown thermally above about 900° C. typically have a significantly higher break down voltage than silicon dioxide films grown at lower temperatures and silicon dioxide films deposited by LPCVD (low pressure chemical vapor deposition) and PECVD (plasma excited chemical vapor deposition). A trench capacitor with high quality trench capacitor dielectric 130A is shown in region 154 and a vertical high power NMOS transistor with high quality trench gate dielectric 130B is shown in region 156. The trench capacitor 154 is formed in a deep pwell 106 that is formed in an n-type substrate 102. The vertical high power NMOS transistor 156 is formed in a pwell 104 that is also formed in the n-type substrate 102. High quality deep trench capacitor dielectric 130A electrically isolates the polysilicon plug 132 top capacitor plate from the capacitor bottom plate formed by the deep p-well 106. High quality deep trench gate oxide 130B electrically isolates the polysilicon plug 134 which forms the vertical NMOS transistor gate, from the source diffusion 136, the drain 102 (substrate) and the body 104 of the vertical NMOS transistor 156.

The top plate 132 of the trench capacitor 154 is connected via a contact plug 144 to interconnect geometry 146. The bottom plate 106 of the trench capacitor 154 is connected to interconnect geometry 150 through the pwell contact 158. The pwell contact plug 144 connects p-well 104 contact diffusion 138 to interconnect geometry 150.

The n+ source diffusion 136 of the vertical NMOS transistor 156 is connected to interconnect geometry 148 via contact plugs 144. The body of the vertical NMOS transistor 156 is pwell 104. When a voltage is applied to the gate 134 an inversion channel forms in the body 104 connecting the source 136 to the drain 102 allowing current to flow from the source 136 to the drain 102. The drain 102 is connected to interconnect geometry 152 through n-type substrate contact diffusion 140 and contact plug 144.

A vertical NMOS transistor 156 is used for illustration but other types of transistors such as a vertical PMOS transistor may also be used. Both a trench capacitor 154 and a vertical MOS transistor 156 are shown in the integrated circuit in FIG. 1. An integrated circuit with a high quality trench oxide may contain either a trench capacitor or a vertical MOS transistor or may contain both.

A method for forming high quality deep trench oxide is illustrated in FIGS. 2A through 2I. The integrated circuit used for illustration contains both a deep trench capacitor and a deep trench vertical transistor. A p-type top and bottom plate capacitor is used for illustration but an n-type top and bottom plate capacitor may also be used. A deep trench vertical NMOS transistor is used for illustration but a deep trench vertical PMOS transistor may also be used.

Figure 2A:
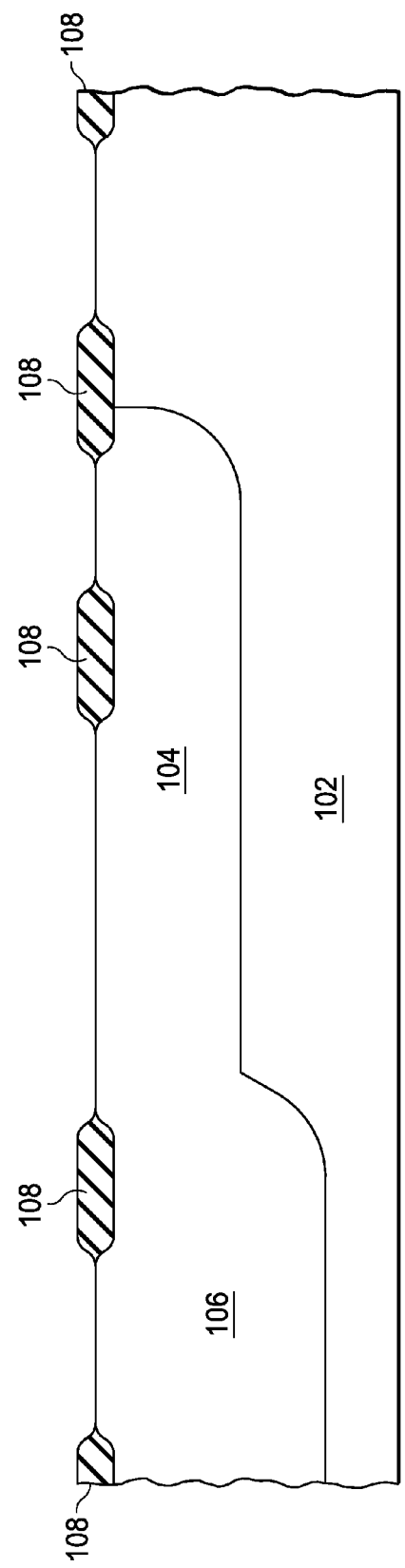

FIG. 2A shows a partially processed integrated circuit containing a deep pwell 106 and a pwell 104 in an n-type substrate 102. Dielectric isolation 108 such as LOCOS (local oxidation of silicon) or STI (shallow trench isolation) is formed in the usual manner to electrically isolate regions where devices are to be formed.

Figure 2B:
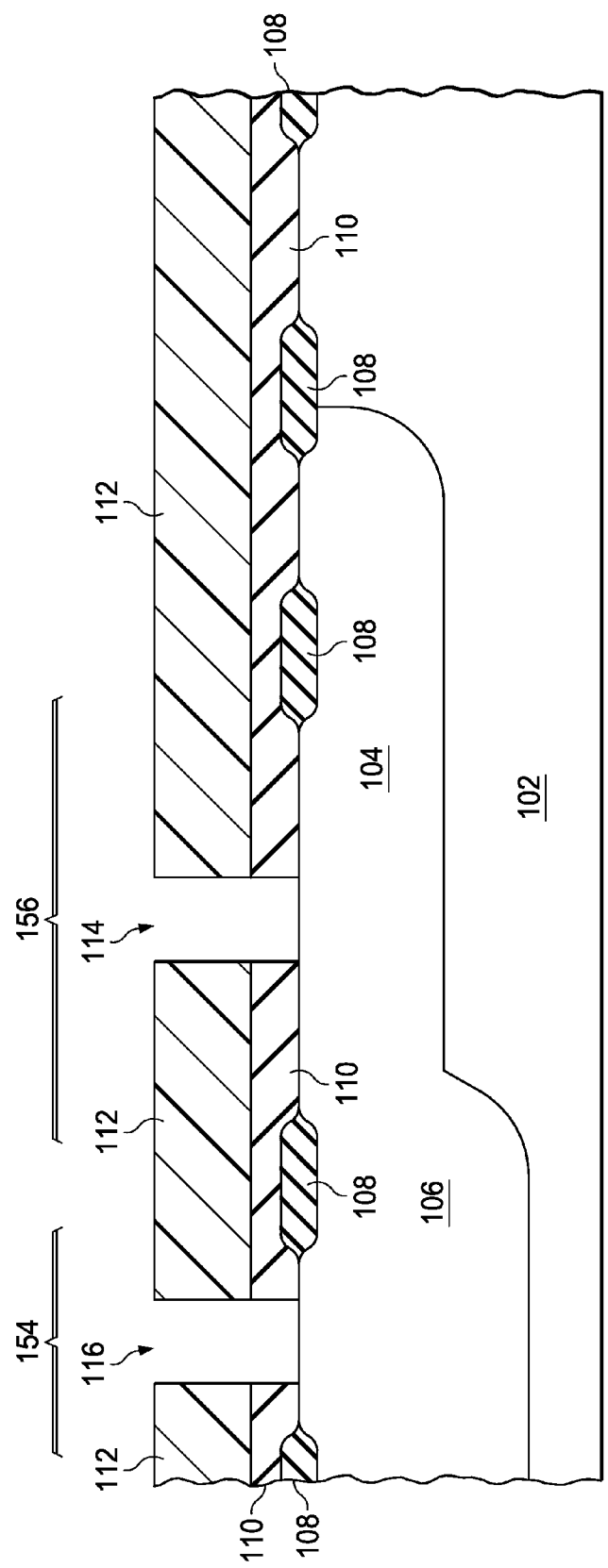

In FIG. 2B a hard mask of dielectric material 110 such as PECVD silicon dioxide is deposited on the integrated circuit and patterned with a trench pattern 112. A first opening 116 is formed in the trench pattern photoresist where the trench capacitor 154 is to be formed and a second opening 114 is formed in the trench pattern photoresist where the vertical NMOS transistor 156 is to be formed. Trench openings 114 and 116 are etched through the hard mask material 110. In an example integrated circuit with high quality trench transistor gate dielectric the hard mask is about 120 nm PECVD oxide. Other hard mask materials may also be used.

Figure 2C:
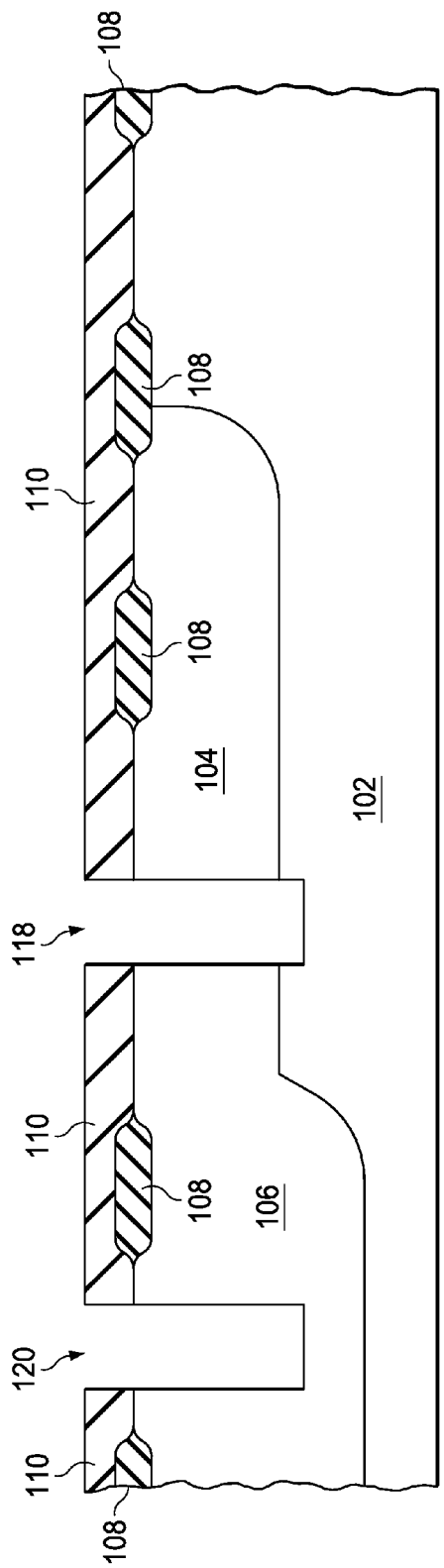

As shown in FIG. 2C, the trench photo resist pattern 112 is removed and the capacitor trench 120 is etched into the deep pwell 106 using the dielectric pattern 110. The vertical transistor trench 118 is etched through the pwell 104 and into the n-type substrate 102 using the hard mask 110. The deep trench is typically etched to a depth in the range of 0.6 um to 6 um but may be etched to another depth if desired.

Figure 2D:
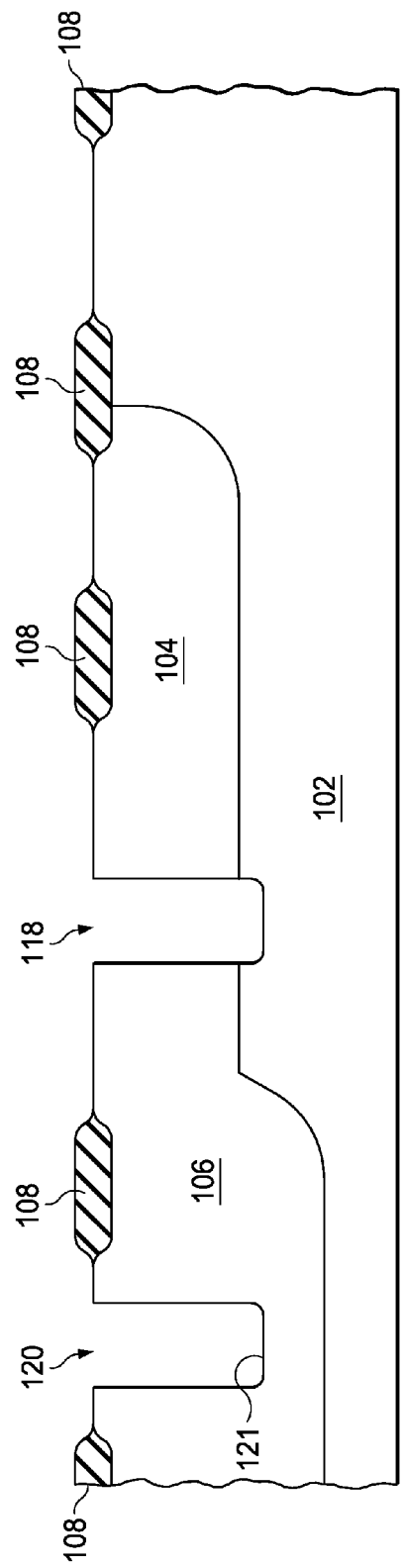

Referring now to FIG. 2D, the hard mask material 110 is etched away with dilute HF and a plasma soft etch is performed to reduce roughness on the trench sidewalls and to round the bottom corners 121 of the trench. (In a soft etch the substrate bias is low low or off to reduce damage to the substrate due to ion bombardment.) This improves the quality and endurance of the trench dielectric by removing sharp corners and points which enhance the electric field causing increased leakage current through the dielectric. Typically the breakdown voltage is also lower at sharp corners and points. The plasma soft etch rate is between about 30 nm and 60 nm per second and removes between about 10 nm to 30 nm of silicon per side from the trench sidewalls. The plasma soft etch is performed at room temperature using $CF_4$ and $O_2$ where the ratio of $CF_4/O_2$ is in the range of about 0.35 to 0.65. The flow of $CF_4$ is in the range of 40 to 60 sccm. The flow of $O_2$ is in the range of 90 to 110 sccm. Pressure is in the rage of 25 to 45 Pa. Temperature is in the range of about 20° C. to 30° C. Power is in the range of 300 W to 500 W. An example plasma soft etch is performed at 25° C. with a pressure of 35 Pa, a power of 400 W, 50 sccm $CF_4$, and 100 sccm $O_2$.

Figure 2E:
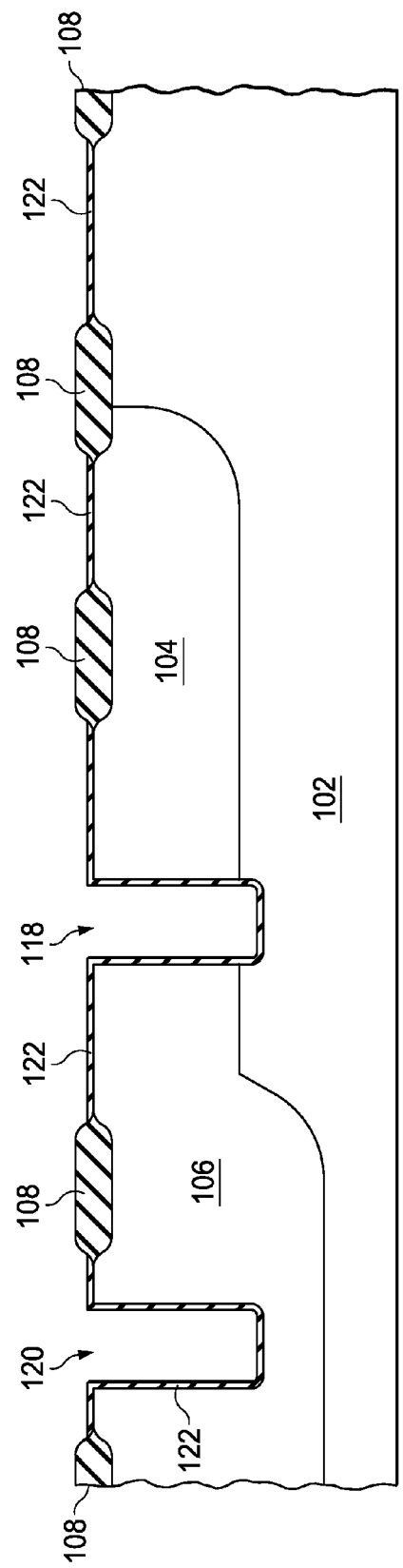

In FIG. 2E a sacrificial oxide 122 is grown on the sidewalls and the bottom of the trench to additionally smooth the surface of the trench on which the high quality dielectric is to be grown. The sacrificial oxide 122 is grown to a thickness in the range of 10 nm to 50 nm at atmospheric pressure in diluted oxygen (50% to 80% atomic percent oxygen in nitrogen) at a temperature in the range of 1050° C. to 1250° C. An example sacrificial oxide 122 is grown to a thickness of 400 nm at 1150° C. with 15 slm $N_2$ plus 10 slm $O_2$.

Figure 2F:
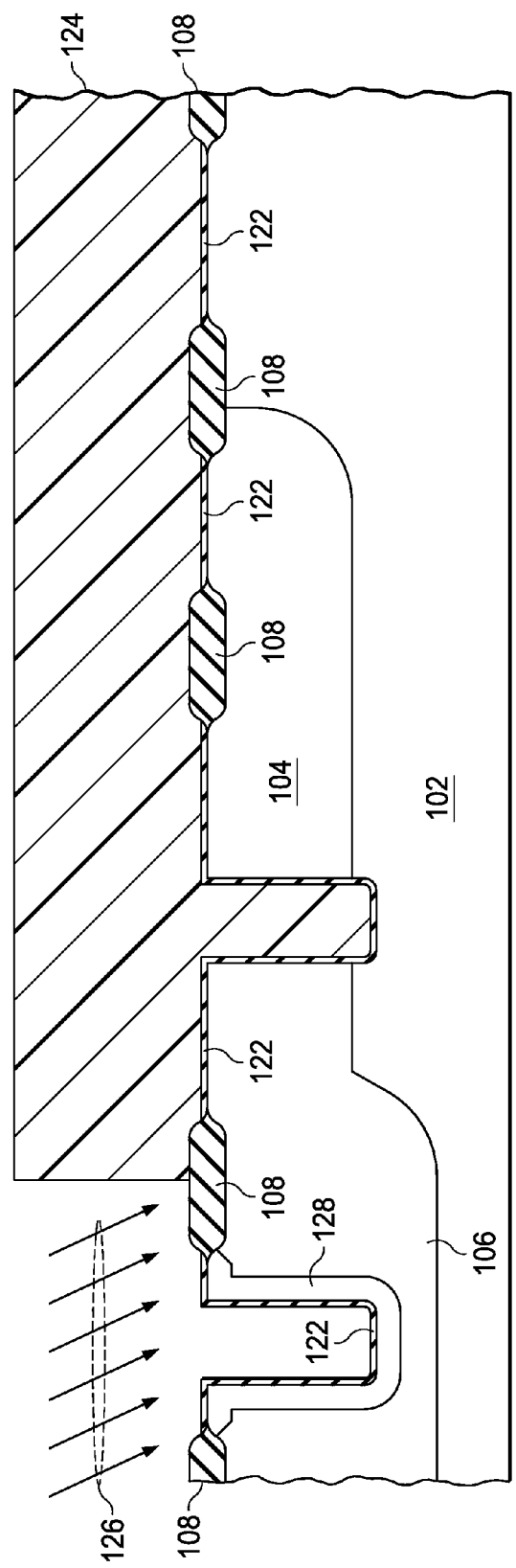

As shown in FIG. 2F, an optional implant 126 may be performed using a capacitor implant photo pattern 124 to increase the doping of the bottom plate 128 of the trench capacitor 154.

Figure 2G:
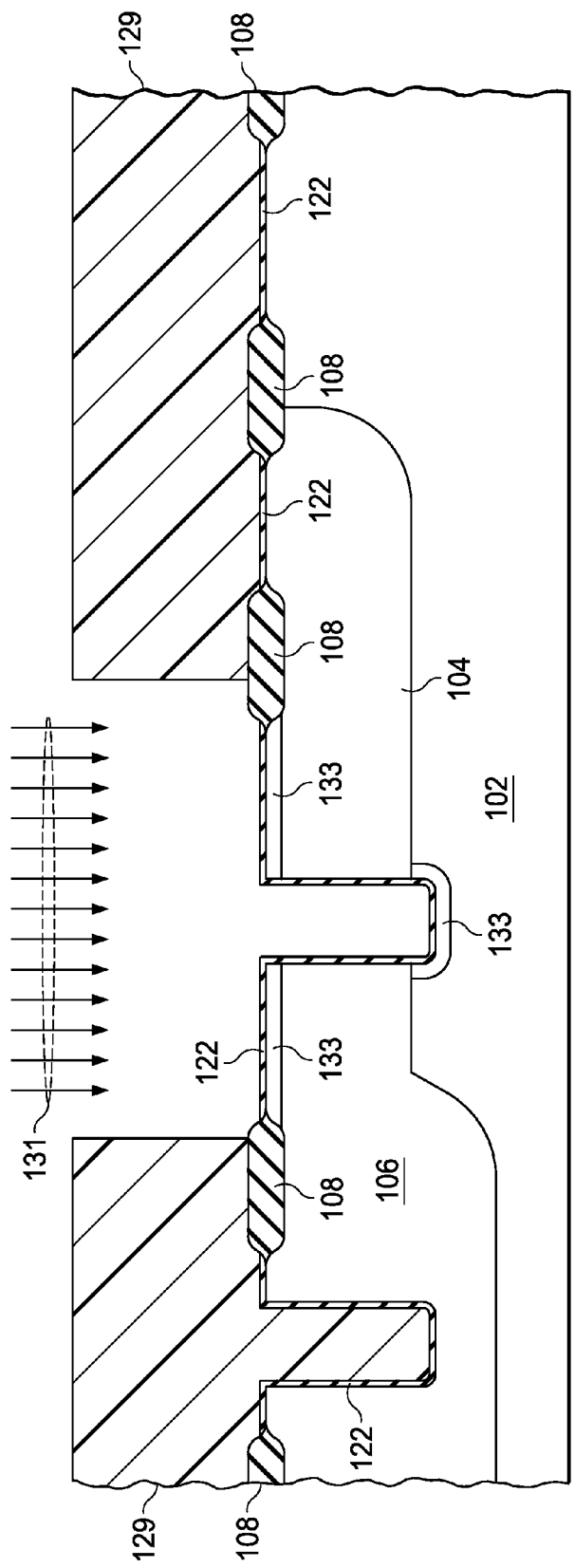

As shown in FIG. 2G, an optional implant 131 may be performed using a vertical transistor photo pattern 129 to increase the doping of the vertical transistor drain 133 at the bottom of the vertical MOS transistor 156 gate trench 118.

Referring now to FIG. 2H, the sacrificial oxide 122 is removed with dilute HF.

In FIG. 2I, the high quality trench dielectric 130 is grown on the sidewalls and bottom of the trench capacitor 120 and on the sidewalls and bottom of the vertical NMOS transistor 156 gate trench 118. The high quality trench dielectric 130 is grown on the trench sidewalls and bottom that are smoothed and the corners at the bottom of the trench rounded with the soft etch and sacrificial oxidation. The high quality trench oxide 130 is grown in a dilute oxygen ambient plus trans 1,2 dichlorethylene (TLC) and followed by a high temperature anneal. The oxygen flow rate may be in the range of 3 to 7 slm, the nitrogen flow rate in the range of 8 to 12 slm, and the TLC flow rate in the range of 0.1 to 0.5 slm. The ratio of $N_2/O_2$ may be in the range of about 0.25 to 0.875. The high quality trench oxide is grown at a temperature between 1050° C. and 1250° C. and at atmospheric pressure. The growth time is variable depending upon the thickness to be grown. Unlike typical trench oxides where the ratio of the trench oxide thickness on the sidewalls of the trench to the thickness on the bottom of the trench is typically greater than 1.5 and may be as high as 1.7, the ratio of the thicknesses of an embodiment high quality trench oxide is typically about 1.2 or less.

The high quality trench oxidation step is followed by an anneal step for between about 1 min. and 3 min. in an inert ambient at a temperature between about 1050° C. and 1250° C. and at atmospheric pressure.

In an example integrated circuit high quality trench oxide with a thickness of 400 nm is grown in a trench that is about 0.75 um deep. The high quality trench oxide is grown at atmospheric pressure in 10 slm $N_2$, 5 slm $O_2$, and 0.235 slm TLC at a temperature of 1150° C. The ratio of the thicknesses of high quality trench oxide on the trench sidewall to the trench bottom is 1.1. The improved trench oxide uniformity improves the electrical properties of the transistors when the high quality trench oxide 130 is the gate dielectric and improves the electrical properties of the trench capacitors when the high quality trench oxide 130 is the capacitor dielectric.

As shown in FIG. 2I, the trenches are filled with a conductive material such as doped polysilicon 135. In an example integrated circuit, the trenches are filled with polysilicon that is doped n-type using $POCl_3$.

Figure 2J:
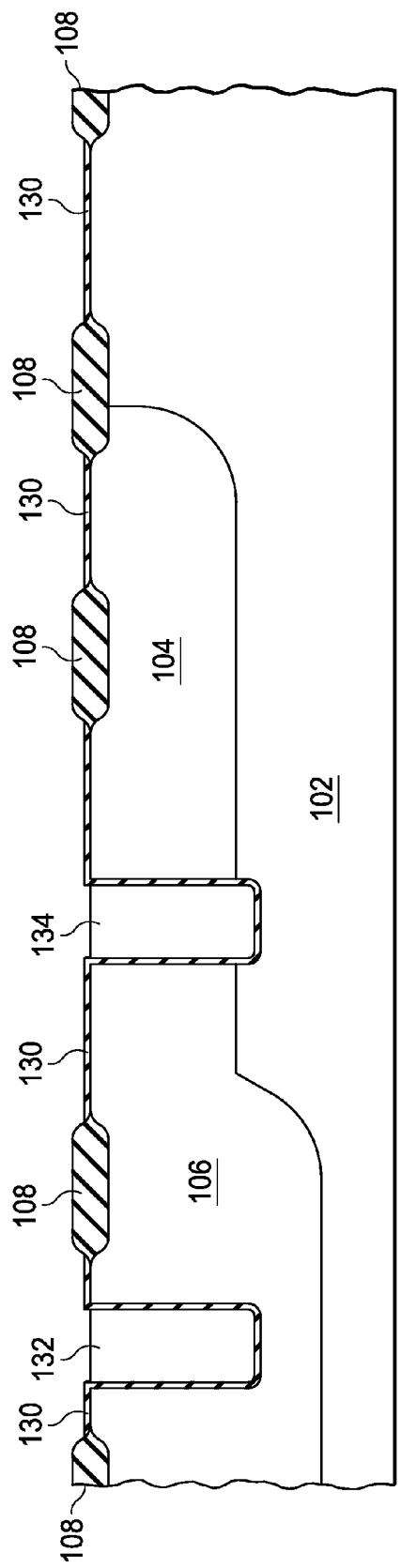

In FIG. 2J excess polysilicon 135 is removed by a blanket plasma etch back or by chemical mechanical polish (CMP).

Additional processing may be performed in the usual manner to produce the integrated circuit shown in FIG. 1. N-type diffusions are implanted to form the source 136 and drain 140 diffusions. P-type diffusions are implanted to form the contact 138 to the pwells 104 and 106. Premetal dielectric (PMD) 142 is deposited and contact plugs 144 are formed through the PMD to connect the diffusions 136, 138, and 140 to the interconnect geometries 148, 150 and 152. Additional layers of dielectric and interconnect may be added to complete the integrated circuit.

Figure 3:
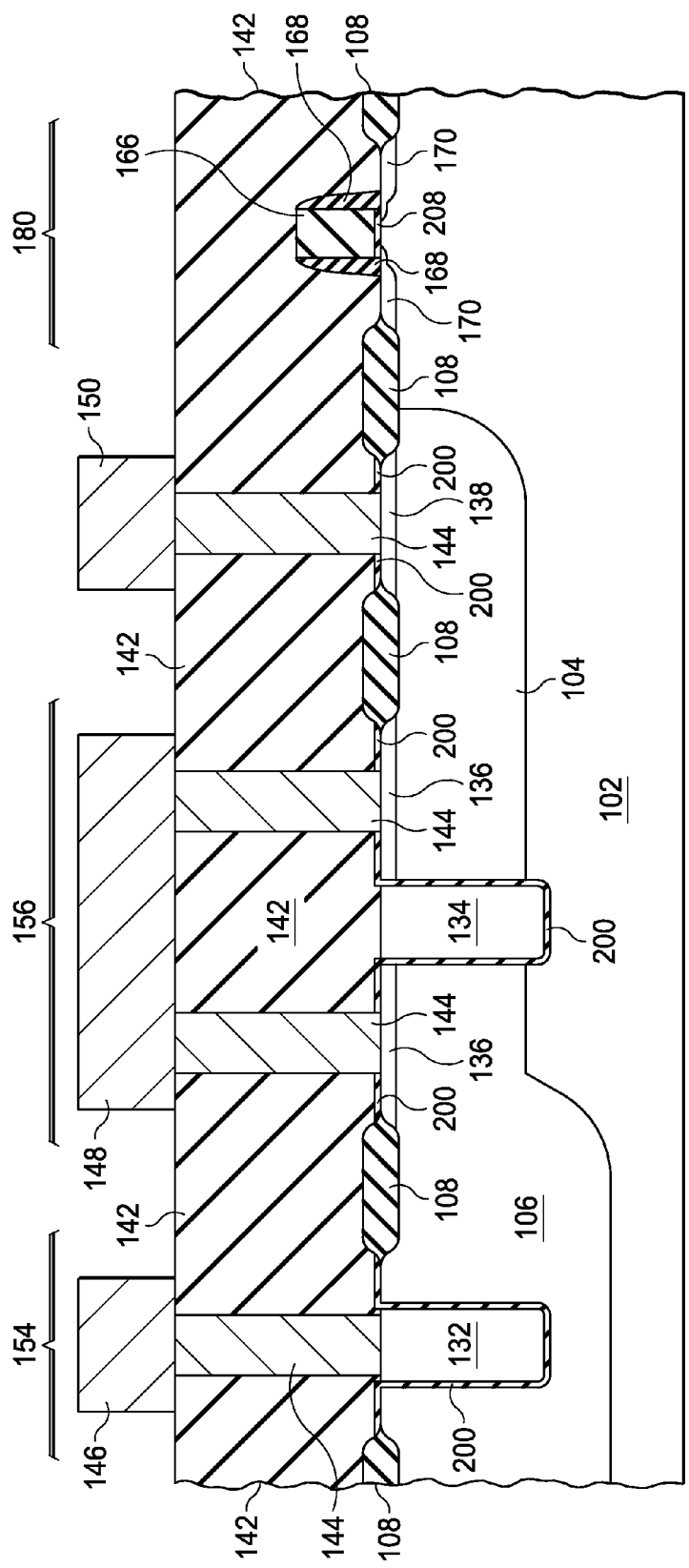
FIG. 3 is a cross section of an example integrated circuit containing a planar MOS transistor and a trench with high quality trench oxide on the sidewalls and bottom of the trench

In FIGS. 2A-2J the p-type capacitor 154 and the vertical NMOS transistor 156 are formed together in the same process flow. As is evident to those skilled in the art, a discrete p-type capacitor device 154 may be formed without the vertical NMOS transistor 156 or a discrete vertical NMOS transistor 156 device may be formed without the p-type capacitor 154 with modification to the process flow. By changing the doping of substrate 102, wells 104 and 106, and diffusions 136, 138, and 140, an n-type capacitor and/or a vertical PMOS transistor may also be formed An integrated circuit with a planar transistor 180 and with trenches 154 and 156 with high quality trench oxide 200 is shown in FIG. 3. The planar transistor consists of the transistor gate dielectric 208, the transistor gate 166, transistor sidewalls 168, and transistor source and drain diffusions 170. The trench capacitor 154 and vertical trench NMOS transistor 156 structures are as described previously.

A PMOS transistor 180 is used for illustration, but an NMOS transistor (formed in the pwell 104) or both PMOS and NMOS transistors may be formed on an integrated circuit that also contains a trench with high quality trench oxide.

The major steps in the fabrication of an integrated circuit with both planar transistors and trenches with high quality trench oxide is illustrated in FIGS. 4A through 4D.

Figure 4A:
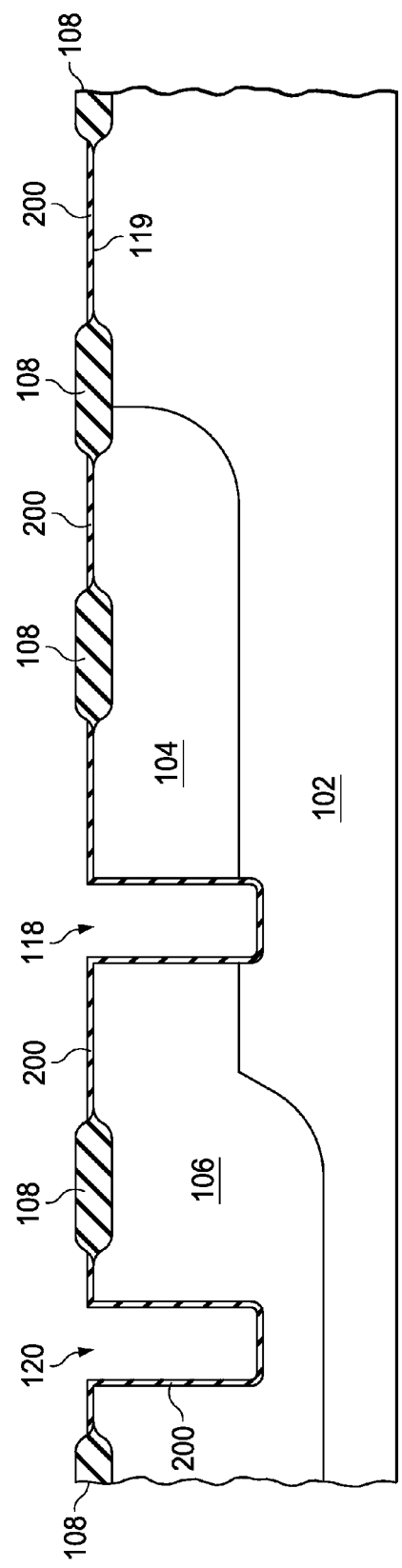
FIG. 4A through FIG. 4D are cross sections of the integrated circuit of FIG. 1 depicted in successive stages of fabrication.

FIG. 4A is the same as FIG. 2H with high quality trench oxide 200 partially grown in the trenches, 118 and 120, and on the surface 119 of the integrated circuit.

Figure 4B:
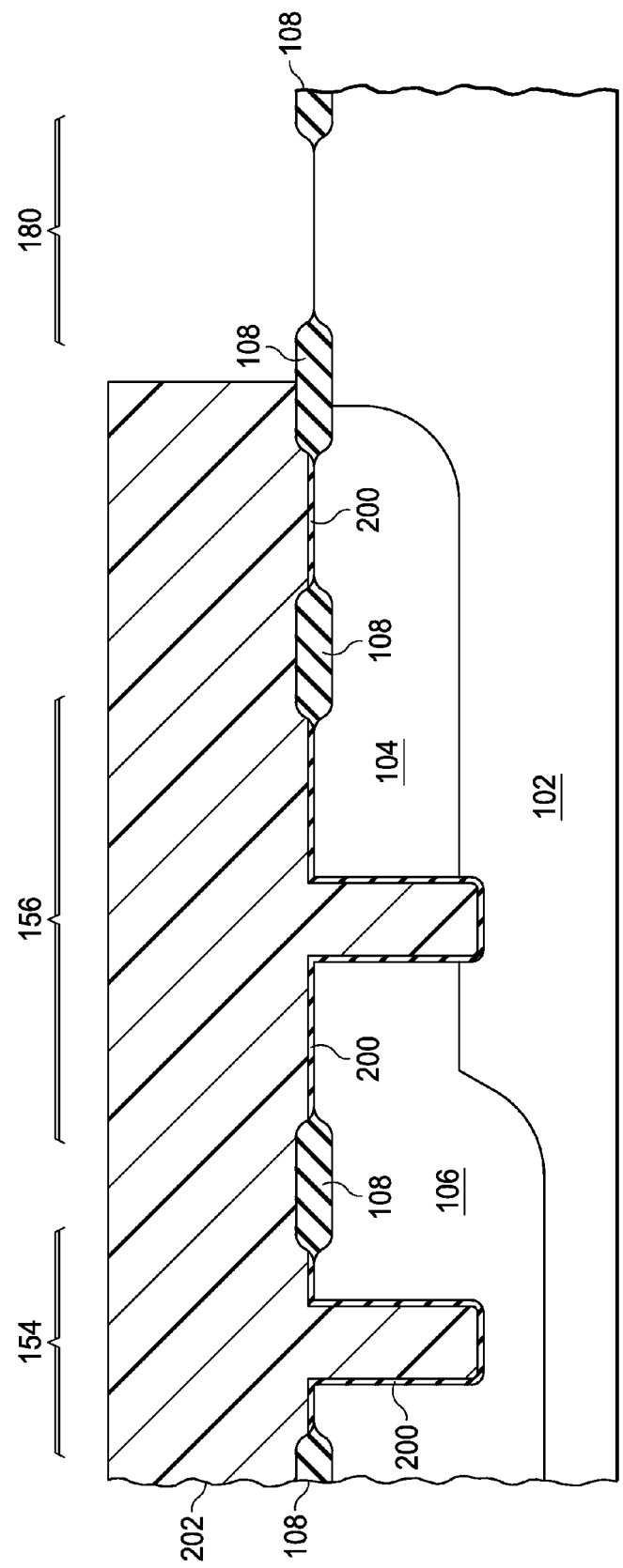

As shown in FIG. 4B, a gate oxide photo resist pattern 202 is formed on the integrated circuit to protect the partially grown high quality trench dielectric in the trench regions 154 and 156 and to expose the dielectric where the planar transistor 180 is to be formed. The partially grown high quality trench dielectric is removed from the planar transistor area 180 using dilute buffered HF.

Figure 4C:
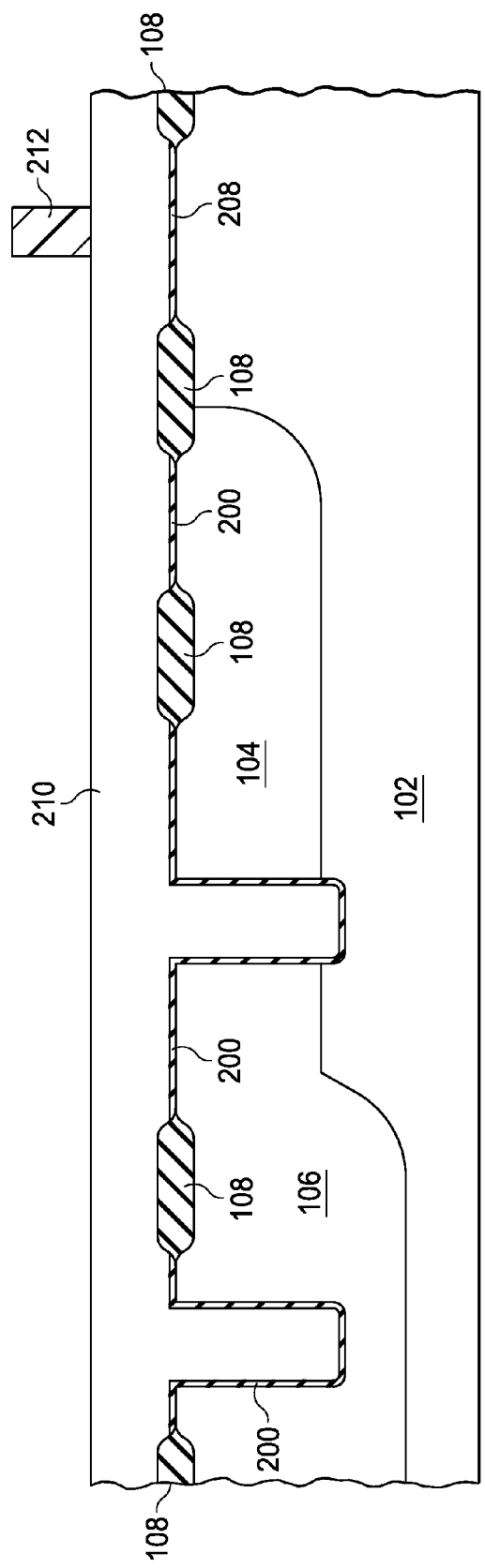

Referring now to FIG. 4C, the gate dielectric 208 is grown to the desired gate dielectric thickness. During the planar transistor gate oxide 208 growth step, the high quality trench oxide 200 grows to a final desired thickness.

Polysilicon 210 is deposited to fill the trenches and to form the gate material for the planar transistor 180. A planar gate photo resist pattern is formed with a photo resist geometry 212 where planar transistor gate is to be fabricated.

Figure 4D:
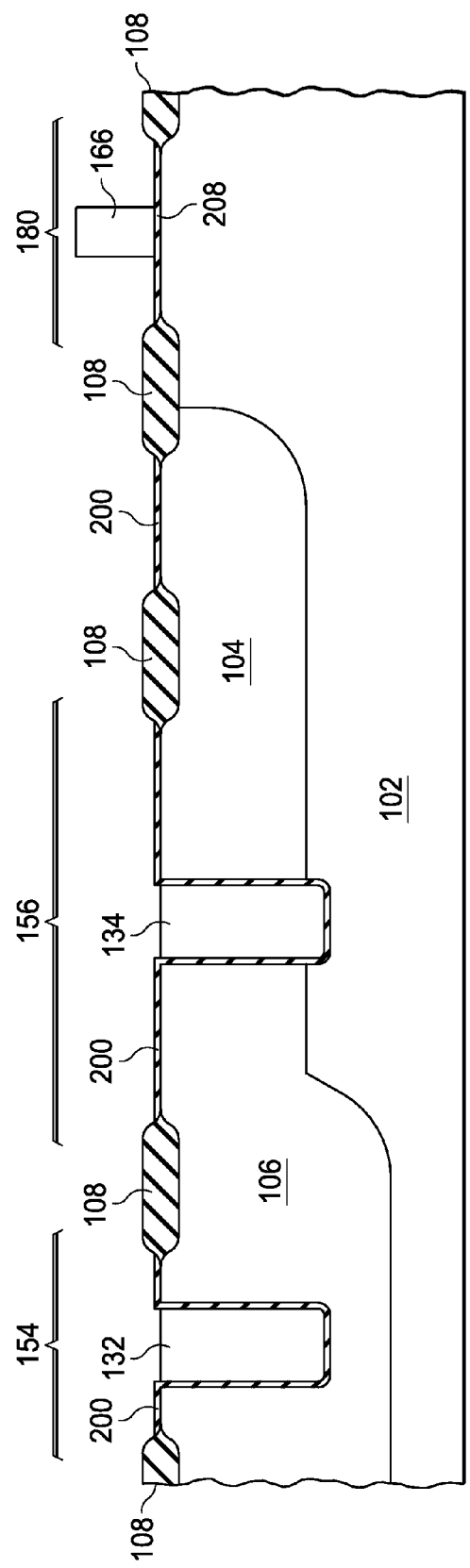

Referring now to FIG. 4D, the polysilicon layer 210 is etched to remove the polysilicon overfill. The trench capacitor 154 top plate 132, the vertical trench MOS transistor 156 gate 134 and the planar transistor 180 gate 166 are formed during this etch.

Additional processing is performed in the usual manner to produce the integrated circuit shown in FIG. 3. N-type diffusions are implanted to form the source 136 diffusions. Sidewalls 168 are formed on the planar PMOS transistor 180 gate 166 and p-type diffusions 170 are implanted to form the source and drain diffusions of the planar PMOS transistor 180 and to form the contact diffusion 138 to the pwells 104 and 106. Premetal dielectric (PMD) 142 is deposited and contact plugs 144 are formed through the PMD to connect the diffusions 136 and 138 to the interconnect geometries 148 and 150. Additional layers of dielectric and interconnect may be added to complete the integrated circuit.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
    forming a trench pattern on a silicon substrate of the integrated circuit;
    etching a trench into the silicon substrate to a depth between 0.6 um and 6 um;
    removing the trench pattern;
    performing a plasma soft etch;
    growing a sacrificial oxide in dilute oxygen ambient at a temperature in the range of 1050° C. to 1250° C. to a thickness in the range of 10 nm to 50 nm;
    removing the sacrificial oxide by etching in dilute HF;
    growing a high quality trench oxide at a temperature in the range of 1050° C. to 1250° C. in an ambient of nitrogen, oxygen, and trans 1,2 dichloroethylene (TLC);
    annealing the high quality trench oxide in an inert ambient at a temperature in the range of 1050° C. to 1250° C.; and
    depositing polysilicon to fill the trench.

2. The method of claim 1, wherein the high quality trench oxide forms a gate dielectric of a vertical MOS transistor further including the steps:
    forming a trench transistor implant pattern on the integrated circuit after the step of growing a sacrificial oxide;
    implanting dopant to form a drain diffusion in the bottom of the trench; and
    removing the trench transistor implant pattern prior to the step of removing the sacrificial oxide.

3. The method of claim 1, wherein the high quality trench oxide forms a capacitor dielectric of a trench capacitor further including the steps:
    forming a trench capacitor implant pattern on the integrated circuit after the step of growing a sacrificial oxide;
    implanting dopant into the sidewalls and bottom of the trench capacitor to increase the doping of the capacitor bottom plate; and
    removing the trench capacitor implant pattern prior to the step of removing the sacrificial oxide.

4. The method of claim 1, wherein the sacrificial oxide is grown in diluted oxygen with an atomic percent of 50% to 80% oxygen in nitrogen.

5. The method of claim 1, wherein the ambient of the plasma soft etch is $CF_4$ and $O_2$ gas with a ratio of $CF_4$ to $O_2$ in the range of 0.35 to 0.65, power in the range of 300 W to 500 W, pressure in the range of 25 to 45 Pa, and temperature in the range of 20° C. to 30° C.

6. The method of claim 1, wherein the plasma soft etch is performed at 25° C. with a pressure of 35 Pa, a power of 400 W, and with a ratio of $CF_4$ to $O_2$ of 0.5.

7. The method of claim 1, wherein the ratio of $O_2/N_2$ during the growth of the high quality trench oxide is in the range of 0.25 to 0.875 plus about 0.1 to 0.5 slm TLC.

8. The method of claim 1, wherein the high quality trench oxidation is performed at 1150° C. with 10 slm $N_2$, 5 slm $O_2$, and 0.235 slm TLC.

9. The method of claim 1, wherein the anneal is performed at 1150° C., in $N_2$ for a time in the range of 1 min. to 3 min.

10. A method of forming an integrated circuit, comprising the steps:
- forming a trench pattern on a silicon substrate of the integrated circuit;
- etching a trench into the silicon substrate to a depth of between 0.6 um and 6 um;
- removing the trench pattern;
- performing a plasma soft etch in $CF_4$ plus $O_2$ with a ratio of $CF_4/O_2$ in the range of 0.35 to 0.65, power in the range of 300 W to 500 W, a pressure in the range of 25 Pa to 45 Pa and a temperature in the range of 20° C. to 30° C.;
- growing a sacrificial oxide with a temperature in the range of 1050° C. to 1250° C. and a thickness in the range of 10 nm to 50 nm in an ambient of $O_2$ plus $N_2$ with a ratio in the range of 0.5 to 0.83;
- removing the sacrificial oxide by etching in dilute HF;
- partially growing a high quality trench oxide at a temperature in the range of 1050° C. to 1250° C. in an ambient of nitrogen, oxygen, and trans 1,2 dichloroethylene (TLC);
- forming a transistor gate photoresist pattern on the integrated circuit where the photoresist pattern covers the trench and exposes an area where a planar MOS transistor is to be formed;
- removing the partially grown high quality trench oxide from the area where the planar MOS transistor is to be formed;
- removing the transistor gate photoresist pattern;
- growing a planar transistor gate dielectric at a temperature in the range of 1050° C. to 1250° C. in an ambient of nitrogen, oxygen, and TLC and also growing the high quality trench oxide to a final thickness;
- annealing the high quality trench oxide at a temperature in the range of 1050° C. to 1250° C. in an inert ambient;
- depositing polysilicon to fill the trench and to provide gate material for the planar MOS transistor;
- forming a planar transistor gate pattern on the integrated circuit; and
- etching the polysilicon to form a polysilicon plug that fills the trench and to form the gate of the planar MOS transistor.

11. The method of claim 10, wherein the high quality trench oxide forms a gate dielectric of a vertical MOS transistor and the polysilicon plug forms a gate of a vertical MOS transistor further including the steps:
- forming a trench transistor implant pattern on the integrated circuit after the step of growing a sacrificial oxide;
- implanting dopant to form a drain diffusion in the bottom of the trench; and
- removing the trench transistor implant pattern prior to the step of removing the sacrificial oxide.

12. The method of claim 10, wherein the high quality trench oxide forms a capacitor dielectric of a trench capacitor and the polysilicon plug forms a top plate of the trench capacitor further including the steps:
- forming a trench capacitor implant pattern on the integrated circuit after the step of growing a sacrificial oxide;
- implanting dopant into the sidewalls and bottom of the trench capacitor to increase the doping of a bottom plate of the trench capacitor; and
- removing the trench capacitor implant pattern prior to the step of removing the sacrificial oxide.

13. The method of claim 10, wherein the plasma soft etch ambient $CF_4/O_2$ ratio is 0.5, the pressure is 35 Pa, the power is 400 W, and the temperature is 25° C.

14. The method of claim 10, wherein the partial growing of the high quality trench oxide and the growing of the planar transistor gate oxide is performed at a temperature of 1150° C. in 10 slm $N_2$, 5 slm $O_2$, and 0.235 slm TLC and where the anneal is performed at a temperature of 1150° C. in 10 slm $N_2$ for 2 min.

* * * * *